United States Patent
Jung

(10) Patent No.: US 11,393,856 B2
(45) Date of Patent: Jul. 19, 2022

(54) IMAGE SENSING DEVICE

(71) Applicant: SK hynix Inc., Icheon-si (KR)

(72) Inventor: Woo Yung Jung, Seoul (KR)

(73) Assignee: SK hynix Inc., Icheon-si (KR)

(*) Notice: Subject to any disclaimer, the term of this patent is extended or adjusted under 35 U.S.C. 154(b) by 97 days.

(21) Appl. No.: 16/384,718

(22) Filed: Apr. 15, 2019

(65) Prior Publication Data
US 2020/0152677 A1    May 14, 2020

(30) Foreign Application Priority Data
Nov. 14, 2018    (KR) .................. 10-2018-0139605

(51) Int. Cl.
*H01L 27/146* (2006.01)
*H03K 19/20* (2006.01)

(52) U.S. Cl.
CPC .. *H01L 27/14605* (2013.01); *H01L 27/14629* (2013.01); *H03K 19/20* (2013.01)

(58) Field of Classification Search
CPC ............................................... H01L 27/14605
USPC ......................................................... 257/432
See application file for complete search history.

(56) References Cited

U.S. PATENT DOCUMENTS

| 8,742,560 B2 | 6/2014 | Adkisson et al. |
| 2015/0041781 A1* | 2/2015 | Hatano ............ H01L 27/14636 257/40 |
| 2021/0183916 A1* | 6/2021 | Ando ................ H01L 27/1462 |

FOREIGN PATENT DOCUMENTS

| JP | 2019080017 A * | 5/2019 | ............. H04N 5/369 |
| KR | 10-2016-0149847 | 12/2016 | |
| WO | WO-2019082559 A1 * | 5/2019 | ............. H04N 5/369 |

OTHER PUBLICATIONS

Machine translation of Sachihiro, JP 2019-080017, May 23, 2019 (Year: 2019).*
Machine translation of Yukimoto, WO2019082559, May 2, 2019 (Year: 2019).*

* cited by examiner

*Primary Examiner* — Hsin Yi Hsieh
(74) *Attorney, Agent, or Firm* — Perkins Coie LLP

(57) ABSTRACT

An image sensing device capable of minimizing reflection of light incident upon a metal layer is disclosed. The image sensing device includes a semiconductor substrate in which at least one groove is formed, a reflection prevention layer formed over the semiconductor substrate in a manner that the at least one groove is buried by the reflection prevention layer, and a metal layer formed over the reflection prevention layer, and provided with at least one through-hole corresponding to the at least one groove.

19 Claims, 9 Drawing Sheets

IMAGE SENSING DEVICE

CROSS-REFERENCE TO RELATED APPLICATION

This patent document claims the priority and benefits of Korean patent application No. 10-2018-0139605 filed on Nov. 14, 2018, which is hereby incorporated in its entirety by reference.

TECHNICAL FIELD

The technology and implementations disclosed in this patent document relate to an image sensing device.

BACKGROUND

An image sensing device is a device for capturing light from at least one optical image or objects using photosensitive semiconductors that react to light and converts the captured light into electrical signals. In recent times, with the development of automotive, medical, computer and communication industries, demand for high-speed, high-performance image sensors is rapidly increasing in various technical fields, for example, digital cameras, camcorders, personal communication systems (PCSs), game consoles, surveillance cameras, medical micro-cameras, robots, etc.

One very common type of image sensing device is a charge coupled device (CCD), which has dominated the field of image sensors for a long time. Another common type of image sensing device is a complementary metal oxide semiconductor (CMOS) image sensing device. Therefore, image sensing devices may be broadly classified into CCD-based image sensing devices and CMOS-based image sensing devices. The CMOS image sensing devices are now widely used because they can provide certain advantages over the CD counterparts, including, e.g., combining an analog control circuit and a digital control circuit onto a single integrated circuit (IC).

Cameras with image sensors such as CMOS image sensors can suffer from an image artifact resulting from flare effects. When light is incident upon a metal film such as a metal pad within the image sensing device, there is a possibility that such flare effects can be caused by light reflected from the metal film having a high light reflectivity.

Therefore, there is a need to minimize reflection of light incident upon the metal film.

SUMMARY

This patent document provides, among others, designs of an image sensing device that can minimize unwanted reflection of incident light, thereby improving image quality.

An embodiment of the present disclosure relates to an image sensing device having a structure that is capable of minimizing light reflected from a metal film in the structure.

In accordance with an aspect of the present disclosure, an image sensing device includes a semiconductor substrate, a pixel region formed at the semiconductor substrate to include photosensing pixels that convert light into pixel signals, an adjacent region formed at the semiconductor substrate adjacent to the pixel region and structured to include one or more grooves, a reflection prevention layer formed in the adjacent region over the semiconductor substrate to fill in the one or more grooves, the reflection prevention layer configured to reduce reflection of light incident thereon to reduce light from the adjacent region to the pixel region, and a metal layer formed in the adjacent region over the reflection prevention layer, and structured to include one or more through-holes spatially corresponding to the one or more grooves, respectively.

In accordance with another embodiment, an image sensing device includes a pixel region including a plurality of unit pixels structured to convert light into an electrical signal, a logic region including a plurality of logic circuits, each of which is in communication with one or more of the unit pixels to receive the electrical signal from the pixel region and perform signal processing of the received electrical signal, and a pad region including a pad configured to electrically couple the logic circuits to an external circuit. The pad includes at least one through-hole and a light absorption structure. The at least one through-hole is structured to provide a light reflection path to direct light to the light absorption structure and the light absorption structure is formed to absorb the light received through the at least one through-hole.

In another embodiment of the disclosed technology, an image sensing device includes a semiconductor substrate in which at least one groove is formed, a reflection prevention film formed over the semiconductor substrate in a manner that the at least one groove is buried by the reflection prevention film, and a metal film formed over the reflection prevention film, and provided with at least one through-hole corresponding to the at least one groove.

In another embodiment of the disclosed technology, an image sensing device includes a pixel region in which a plurality of unit pixels formed to convert light into an electrical signal is formed, a logic region in which a plurality of logic circuits, each of which receives the electrical signal from the pixel region and performs signal processing of the received electrical signal, is formed, and a pad region in which a pad configured to electrically couple the logic circuits to an external circuit is formed. The pad includes at least one through-hole, and the pad region includes a light absorption structure formed to absorb incident light received through the at least one through-hole.

In another embodiment of the disclosed technology, an image sensing device includes a semiconductor substrate, a pixel region formed on the semiconductor substrate to include photosensing pixels that convert light into pixel signals; an adjacent region formed on the semiconductor substrate adjacent to the pixel region and structured to include one or more grooves, a reflection prevention layer formed in the adjacent region over the semiconductor substrate to fill in the one or more grooves, the reflection prevention layer configured to reduce reflection of light incident thereon to reduce light from the adjacent region to the pixel region, and a metal layer formed in the adjacent region over the reflection prevention layer, and structured to include one or more through-holes spatially corresponding to the one or more grooves, respectively.

In another embodiment of the disclosed technology, A method of forming an image sensing device including a pad region in which pads are formed to electrically couple logic circuits of the image sensing device to an external circuit outside the image sensing device, includes providing a substrate, forming a plurality of grooves in the pad region on the substrate, forming a reflection prevention layer over the plurality of grooves including inside the plurality of grooves, forming a conductive layer over the reflection prevention layer, coating a photoresist on the conductive layer, patterning the photoresist to define a region in which one or more through-holes are to be formed, such that the one or more through-holes are aligned with one or more of the plurality of grooves, etching the conductive layer using the patterned photoresist covering the conductive layer, thereby exposing the reflection prevention layer through the one or more through-holes, and stripping the photoresist.

BRIEF DESCRIPTION OF THE DRAWINGS

The above and other features and advantages of the disclosed technology will become readily apparent by reference to the following detailed description when considered in conjunction with the accompanying drawings wherein.

DESCRIPTION OF EMBODIMENTS

Figure 1:
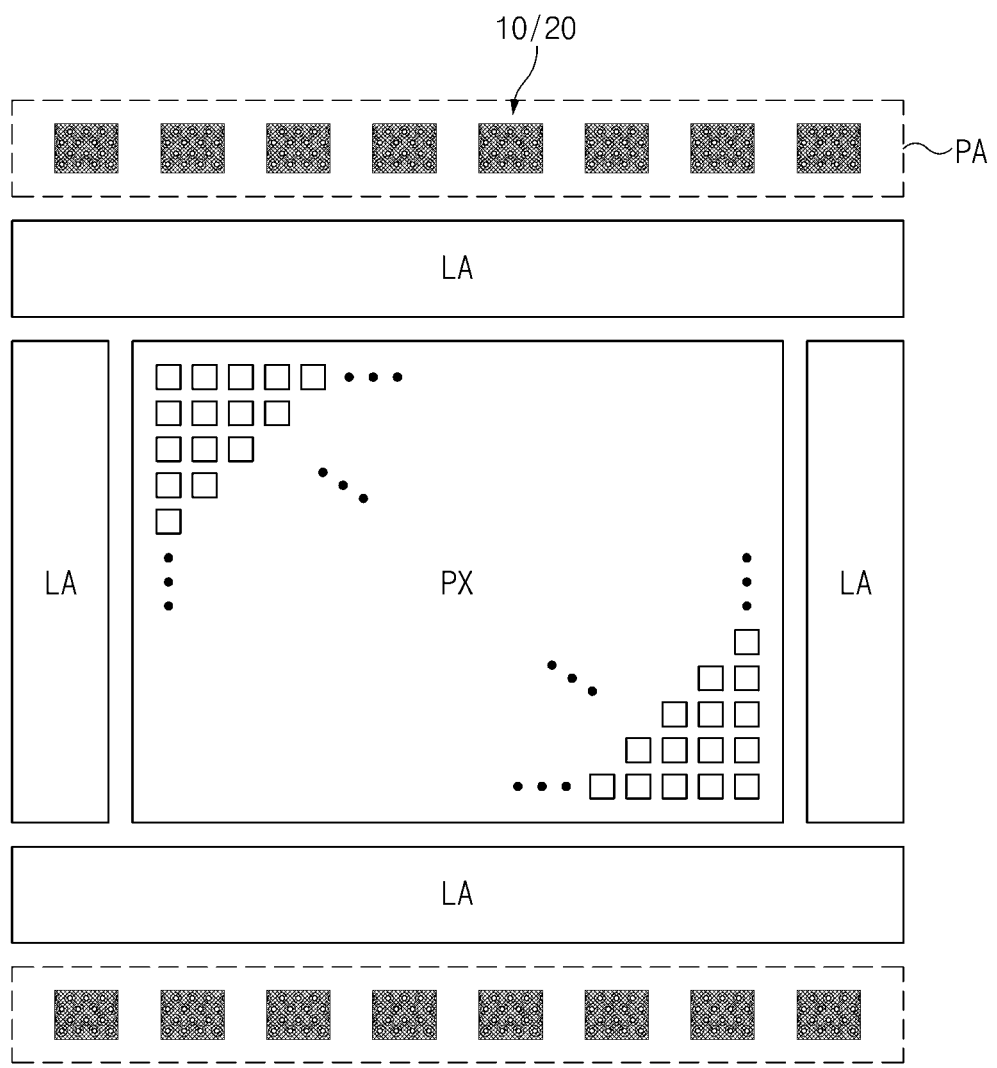
FIG. 1 illustrates an example of an image sensing device based on an embodiment of the disclosed technology.

FIG. 1 illustrates an example of an image sensing device based on an embodiment of the disclosed technology.

Referring to FIG. 1, the image sensing device may include a pixel region PX, a logic region (or logic area) LA, and a pad region (or pad area) PA.

The pixel region PX may be located at an area that can receive light including, for example, the center of the image sensing device, and may include a plurality of unit pixels. The unit pixels may convert light into electrical signals, and may be arranged in a two-dimensional (2D) matrix form. The unit pixels may include photoelectric conversion elements (e.g., photodiodes), color filters, micro-lenses, and pixel transistors. In an implementation of the disclosed technology where the photoelectric conversion elements is formed in a semiconductor substrate, the color filters and the micro-lenses may be formed over a first surface of the semiconductor substrate, and the pixel transistors may be formed over a second surface arranged to face against the first surface of the semiconductor substrate.

The logic region LA may be located near the pixel region PX to make it easier to receive the electrical signals converted from the light incident on the pixel region PX. For example, the logic region LA may be located outside the pixel region PX. The logic region LA may include a plurality of logic circuits to receive electrical signals from the pixel region PX and process the received electrical signal. This logic region LA may include various logic circuits, for example, a correlated double sampler (CDS), an analog-to-digital converter (ADC), a ramp signal generator, and an image processor. The pad region PA may be located near the logic region LA so that the logic region LA can communicate with external devices via the pad region PA. For example, the pad region PA may be located outside the logic region LA, and may include a plurality of pads 20 to electrically couple the logic circuits of the logic region LA to an external circuit. Each pad 20 may include a metal film, and the metal film may be formed either as a single metal film or as a stacked structure of different metal films. For example, each pad may be formed of aluminum (Al) or may be formed as a stacked structure of aluminum (Al) and tungsten (W).

The presence of the pad region PA near the pixel region PX may cause undesired scattering or reflection of incident light in the pad region PA to be directed to the pixel region PA so that the presence of such scattered or reflected light from the pad region PA can adversely impact the imaging detection by the pixel region PA. For example, such scattered or reflected light from the pad region PA may appear as a flare that degrades the imaging detection. To reduce this undesired scattering or reflection of incident light in the pad region PA, the disclosed technology provides structures in the pad region PA to absorb incident light in the pad region PA. In an embodiment of the disclosed technology, each of the pads 20 may include a structure that can provide a light reflection path in a direction from outside the structure to inside the structure. For example, the pads 20 may include a structure including at least one through-hole. In addition, a light absorption structure 10 configured to absorb light received via through-holes of each pad 20 may be formed below the pads 20.

Each pad 20 may be formed over the semiconductor substrate in a manner that some regions of the pad 20 may be coupled to a through substrate via (TSV). For example, one end of each pad 20 may be coupled to the TSV, and may be formed in a flat plate shape horizontally extending from the connection part coupled to the TSV.

Although FIG. 1 illustrates an example implementation in which the pad region PA is located only at both sides of the pixel region PX for convenience of description, it should be noted that the pad region PA may also be arranged to surround the pixel region PX.

Figure 2:
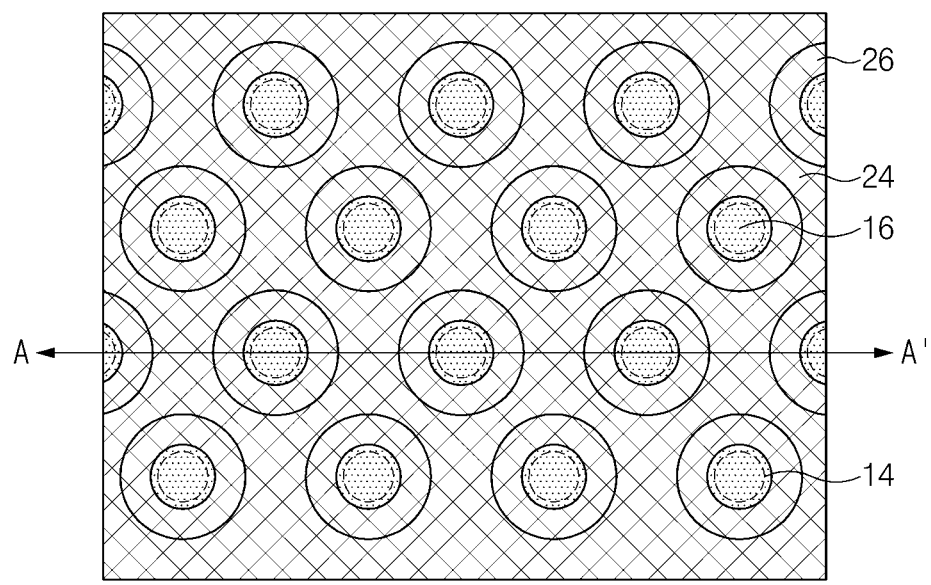
FIG. 2 is a plan view illustrating an example of a light absorption structure and a pad based on an embodiment of the disclosed technology.
Figure 3:
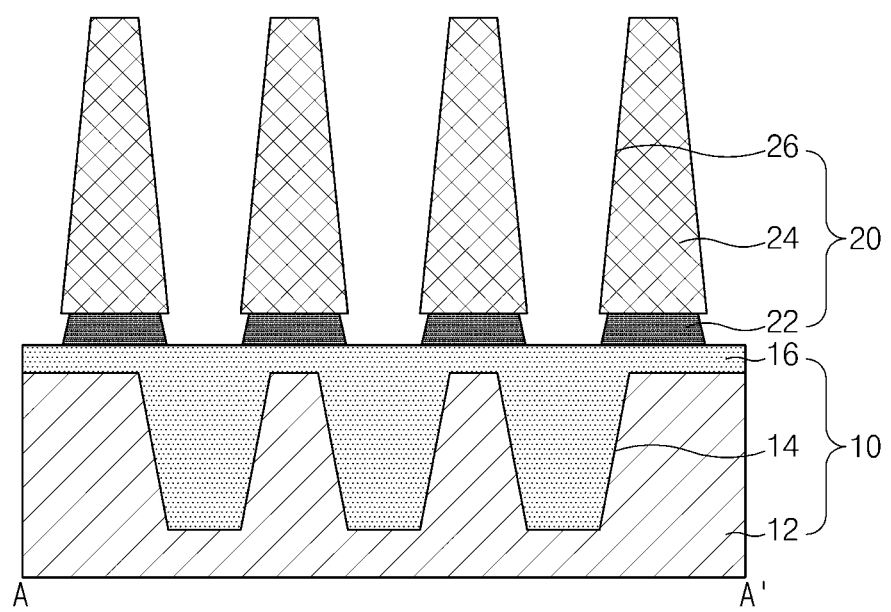
FIG. 3 is a cross-sectional view illustrating an example of the light absorption structure and the pad taken along the line A-A' shown in FIG. 2.

FIGS. 2 and 3 illustrate the light absorption structure 10 and the pad 20 formed in the pad region PA shown in FIG. 1. Specifically, FIG. 2 is a plan view illustrating an example of the light absorption structure 10 and the pad 20, and FIG. 3 is a cross-sectional view illustrating the light absorption structure 10 and the pad 20 taken along the line A-A' shown in FIG. 2. Here, the pad region OA may include the light absorption structure 10 and the pad 20 formed over the light absorption structure 10.

The light absorption structure 10 may include a semiconductor substrate 12 in which a plurality of grooves 14 is formed in an array, and a reflection prevention layer 16 formed over the semiconductor substrate 12 in a manner that the reflection prevention layer 16 is buried in the plurality of grooves 14.

The grooves 14 may be formed by etching the semiconductor substrate 12 to a predetermined depth. In forming the grooves on the semiconductor substrate 12, any etching techniques including wet etching or dry etching can be used. In an embodiment of the disclosed technology, each groove 14 may be formed in a manner that an upper cross-sectional area (e.g., upper portions in a cross-sectional view in FIG. 3) of each groove 14 is larger in size than a lower cross-sectional area (e.g., lower portions in a cross-sectional view in FIG. 3, including a bottom surface of each groove) of each groove 14. That is, each of the grooves 14 may be formed to taper towards the bottom surface in a manner that a horizontal cross-sectional area of each groove 14 gradually decreases in size in a downward direction (i.e., in proportion to a gradually decreasing height).

The grooves 14 may be formed to vertically overlap the through-holes 26 formed in each pad 20. The grooves 14 may be identical or similar in shape to the through-holes 26. For example, each of the grooves 14 may be formed in a manner that a horizontal cross-sectional area of each groove 14 is formed in a circular shape, an oval shape, or any other suitable shape. That is, the grooves 14 may be patterned along with the through-holes 26 within the semiconductor substrate 12 of the pad region PA. In this case, the grooves 14 and the through-holes 26 may be patterned to have the same or similar shapes at the same planar positions when viewed from above.

FIG. 2 illustrates the bottom region of each groove 14 smaller in size than a bottom region of each through-hole 26 by way of example and not by limitation. Thus, for example, the bottom region of each groove 14 may be identical to or larger than the bottom region of each through-hole 26 in terms of their size.

The reflection prevention layer 16 may be used to absorb light received through through-holes 26 of each pad 20, and may be formed between the semiconductor substrate 12 and each pad 20 in a manner that a material capable of sufficiently absorbing light is buried in each groove 14 formed between the semiconductor substrate 12 and each pad 20. A top surface of the reflection prevention layer 16 is planarized such that the reflection prevention layer 16 may be used as a planarization film. The reflection prevention layer 16 may be formed to extend not only to the pixel region PX but also to the logic region LA. The reflection prevention film 16 may include silicon nitride (SiNx), silicon oxide (SiOx), or silicon oxynitride (SiOxNy), or any two or more of silicon nitride (SiNx), silicon oxide (SiOx), or silicon oxynitride (SiOxNy) with or without others. For example, the reflection prevention layer 16 may be formed as a monolayer structure formed of only one material, or may be formed as a multilayer structure in which different materials are stacked.

The pads 20 may be formed over the reflection prevention layer 16, and may include a conductive film in which the plurality of through-holes 26 is formed. In this case, each of the through-holes 26 may be formed in a manner that an upper cross-sectional area (i.e., upper portions in a cross-sectional view in FIG. 3) of each through-hole 26 is larger in size than a lower cross-sectional area of each through-hole 26. That is, each of the through-holes 26 may be formed to taper towards the lower portions thereof in a manner that a horizontal cross-sectional area of each through-hole 26 gradually decreases in size in a downward direction (i.e., in proportion to a gradually decreasing height) in the same manner as in the grooves 14.

The through-holes 26 may be formed to vertically overlap the grooves 14 formed in the semiconductor substrate 14. For example, the through-holes 26 and the grooves 14 may be arranged in a manner that a center point of each through-hole 26 is located at the same vertical line as a center point of a groove 14 to be aligned with through-hole 26.

The pad 20 may include at least one metal film pattern 22 and 24. For example, the pad 20 may include a stacked structure of a tungsten (W) film pattern 22 and the aluminum (Al) film pattern 24. In some embodiments of the disclosed technology, the tungsten (W) film pattern 22 may be formed in parallel with the formation of other layers. For example, the fabrication process of the image sensing device may include forming a through silicon via (TSV) and/or a shielding film for shielding the logic region LA from incident light. In this case, the tungsten (W) film pattern 22 may be formed simultaneously with the formation of the TSV and/or the shielding film.

By the way of example and not by limitation, FIG. 2 illustrates through-holes 26 formed over the entirety of the pads 20. Thus, the through-holes 26 may be formed only at some regions of each pad 20. For example, in an example implementation where some of the plurality of pads 20 or some portions of each pad 20 are coupled to the TSV, through-holes 26 may be formed in the remaining regions other than those pads or those portions that are connected to the TSV.

Figure 4:
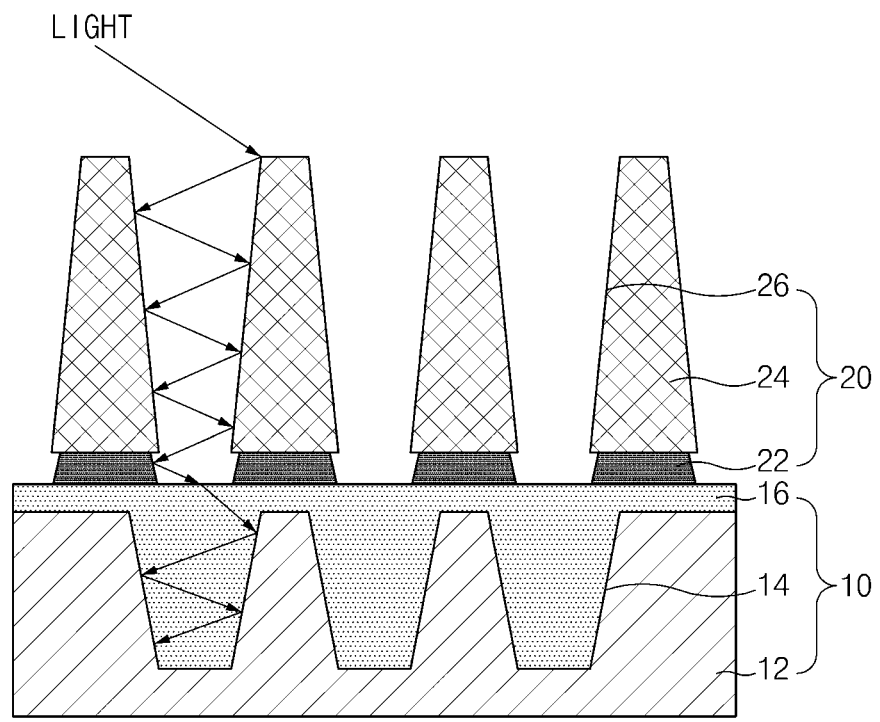
FIG. 4 illustrates an example path of light incident upon a pad shown in FIG. 3.

FIG. 4 illustrates an example path of light incident upon the pad shown in FIG. 3.

Referring to FIG. 4, through-holes 26 may be formed in the pads 20, such that most light incident upon the pads 20 may arrive at the reflection prevention layer 16 through the through-holes 26 without being reflected to outside the pads 20. In this case, the reflection prevention layer 16 may be located below the pads 20. Moreover, the plurality of grooves 14, each of which is formed by etching the semiconductor substrate 12 to a predetermined depth, may be formed below the through-holes 26, and the reflection prevention film 16, which is thick enough to prevent a light reflection is buried in the groove 14, such that light having passed through the through-holes 26 and arrived at the reflection prevention layer 16 formed in the grooves 14 can be absorbed by the reflection prevention layer 16.

In conclusion, light incident upon the pads 20 may be mostly absorbed into the reflection prevention layer 16, such that the amount of light reflected from the pads 20 may be minimized.

FIGS. 5 to 8 illustrate processes for forming the structures shown in FIGS. 2 and 3.

Figure 5:
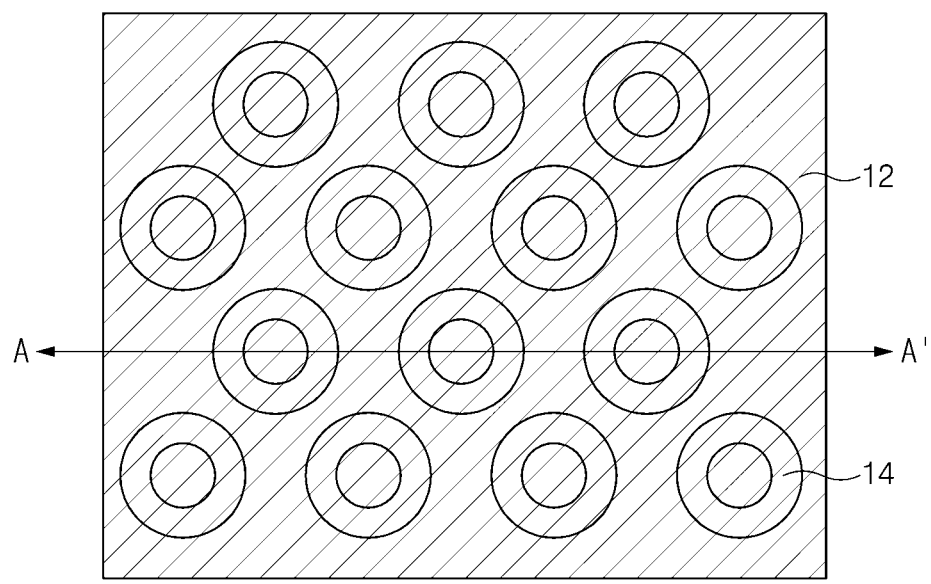
FIGS. 5 to 8 illustrate processes for forming the structures shown in FIGS. 2 and 3.
Figure 5:
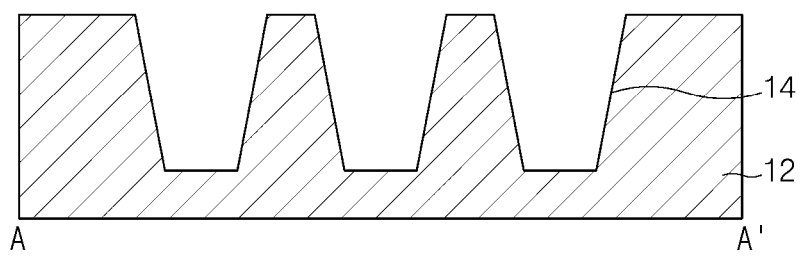

Referring to FIG. 5, a plurality of grooves 14 arranged in an array may be formed in a region to include the pads 20 within the pad region PA of the semiconductor substrate 12.

In some embodiments of the disclosed technology, the structures illustrated in FIGS. 2 and 3 may be fabricated using a photolithography process. For example, a photoresist film is formed over the pad region PA of the semiconductor substrate 12, and exposure and development processes are performed on the photoresist film, forming a photoresist pattern (not shown) defining a specific region in which the plurality of grooves 14 will be formed. In this case, the photoresist pattern may be patterned in a manner that groove patterns are arranged in an array. For example, the groove patterns may have a circular shape, an oval shape, or any other suitable shape.

Subsequently, the semiconductor substrate 12 of the pad region PA may be etched to a predetermined depth using the photoresist pattern as an etch mask, forming the plurality of grooves 14.

Figure 6:
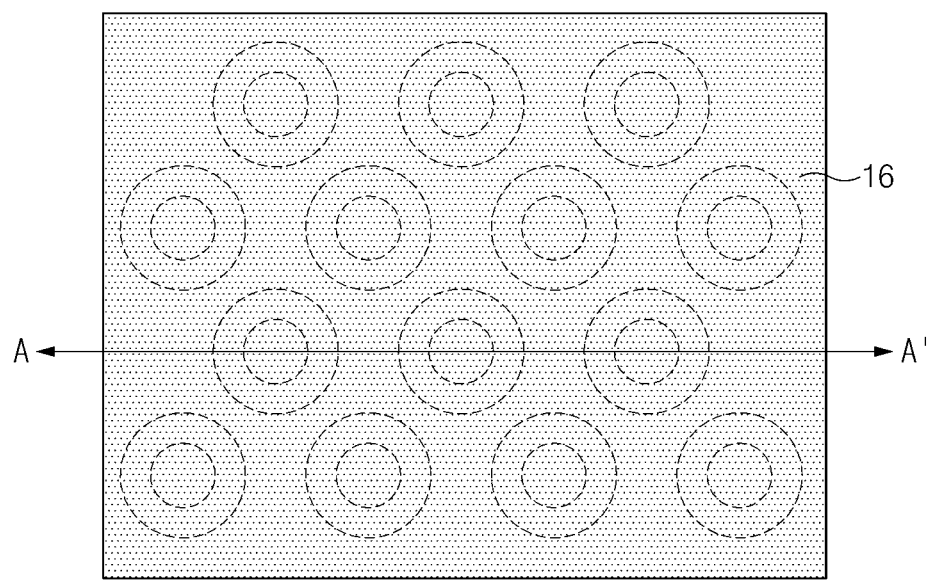
Figure 6:
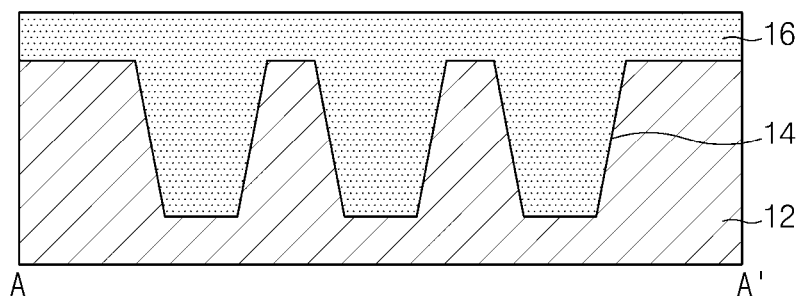

Referring to FIG. 6, the reflection prevention layer 16 may be formed over the semiconductor substrate 12.

For example, after a reflection prevention material is formed over the semiconductor substrate 12 in a manner that the reflection prevention material is buried in the grooves 14, a top surface of the reflection prevention material may be planarized, resulting in formation of the reflection prevention layer 16. The reflection prevention layer 16 may include silicon nitride (SiNx), silicon oxide (SiOx), silicon oxynitride (SiOxNy), or a combination thereof.

By the way of example and not by limitation, FIG. 6 illustrates the reflection prevention film 16 formed only in the region in which the pads 20 are formed, and thus the reflection prevention layer 16 may also be formed to extend not only to the pixel region PX but also to the logic region LA as necessary.

Figure 7:
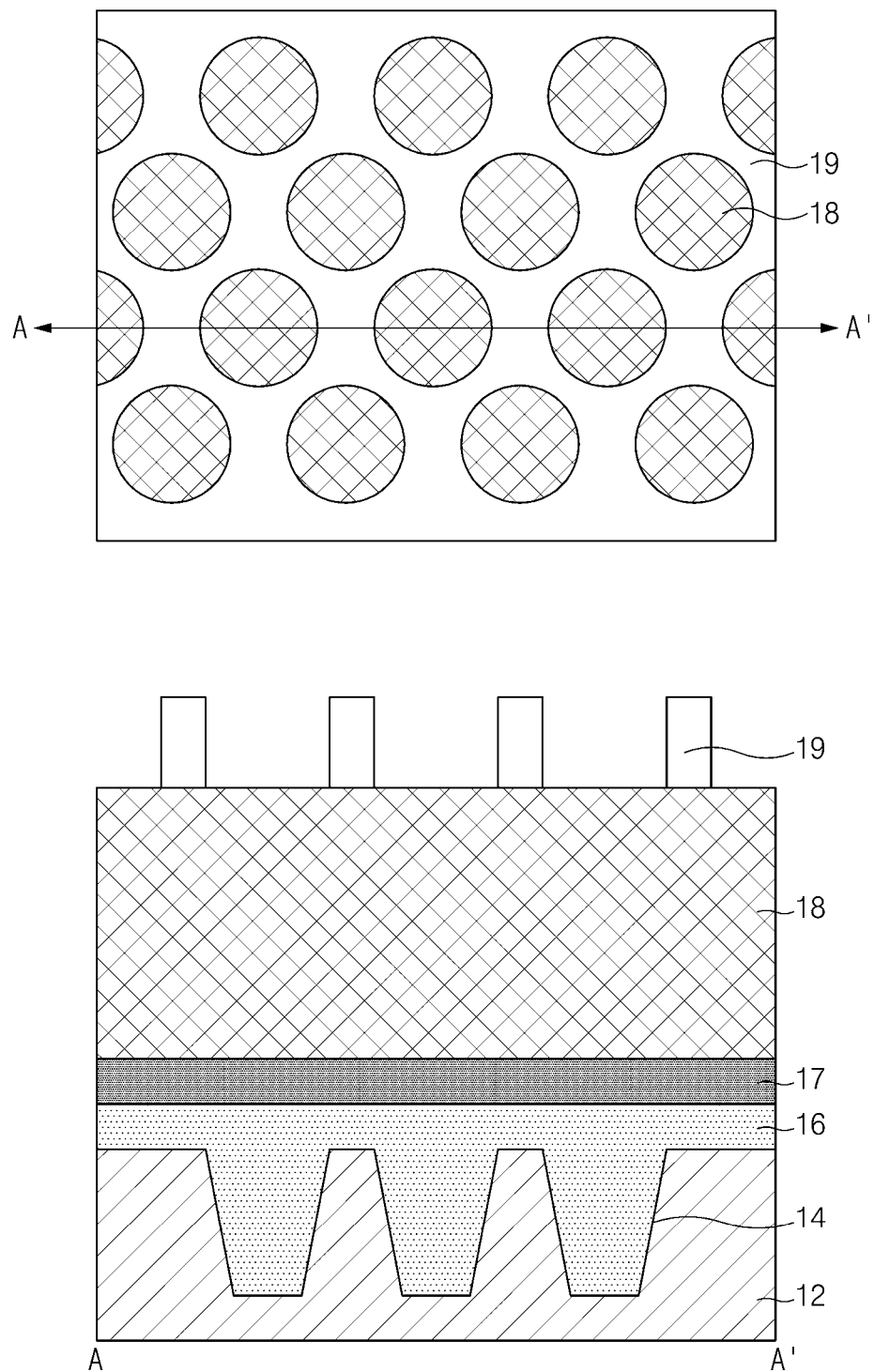

Referring to FIG. 7, a metal layer to be used for such pad (hereinafter referred to as a pad metal layer) may be formed over the reflection prevention layer 16. The metal layer to be used as the pad (i.e., the pad metal film) may be formed as a stacked structure of the tungsten (W) film 17 and the aluminum (Al) film 18. For example, the tungsten film 17 may be deposited over the reflection prevention layer 16, and the aluminum film 18 may be deposited over the tungsten film 17, resulting in formation of the pad metal film. The fabrication process of the image sensing device based on some embodiments of the disclosed technology may include forming a TSV and/or a shielding film for shielding the logic region LA from incident light. In this case, the tungsten film 17 may be formed simultaneously with the formation of the TSV and/or the shielding film.

Subsequently, a photoresist film is formed over the aluminum (Al) film 18, and then the photoresist film is processed by exposure and development, such that a photoresist pattern 19 defining a specific region in which the plurality of through-holes 26 will be formed. For example, the photoresist pattern 19 may include a plurality of through-hole patterns arranged in an array. The through-hole patterns may be arranged to be aligned with the grooves 14 formed in the semiconductor substrate 12. In this case, the through-hole patterns may be formed in a manner that a center point of each through-hole pattern is located at the same vertical line as a center point of each groove 14 formed in the semiconductor substrate 12.

Figure 8:
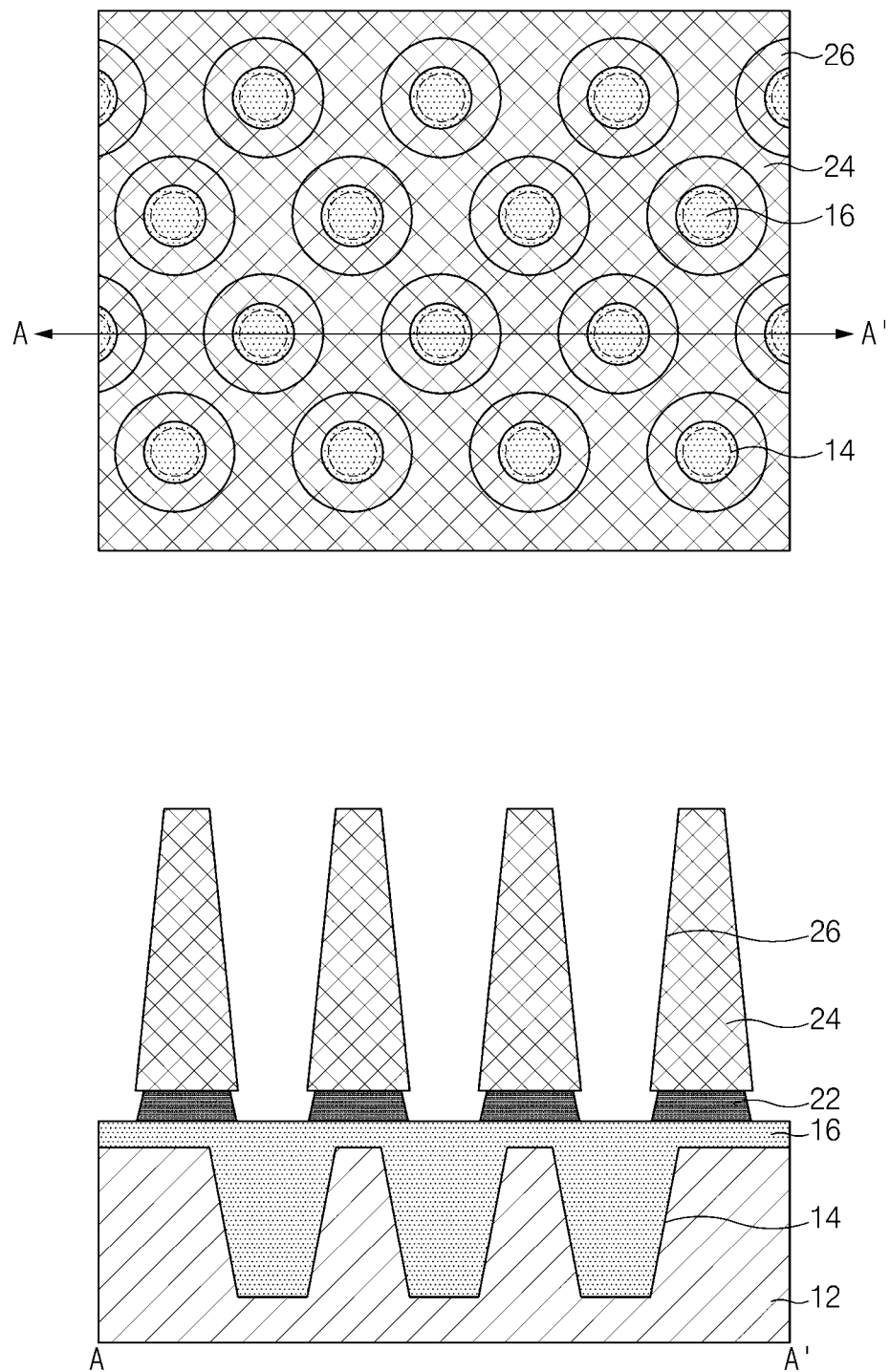

Referring to FIG. 8, the aluminum film 18 and the tungsten film 17 are sequentially etched, using the photoresist pattern 19 as an etch mask, until the reflection prevention layer 16 is exposed, forming a plurality of pad structures, each including the aluminum film pattern 24 and the tungsten film pattern 22, with the through-holes 26 being formed in the pad structure.

Figure 9:
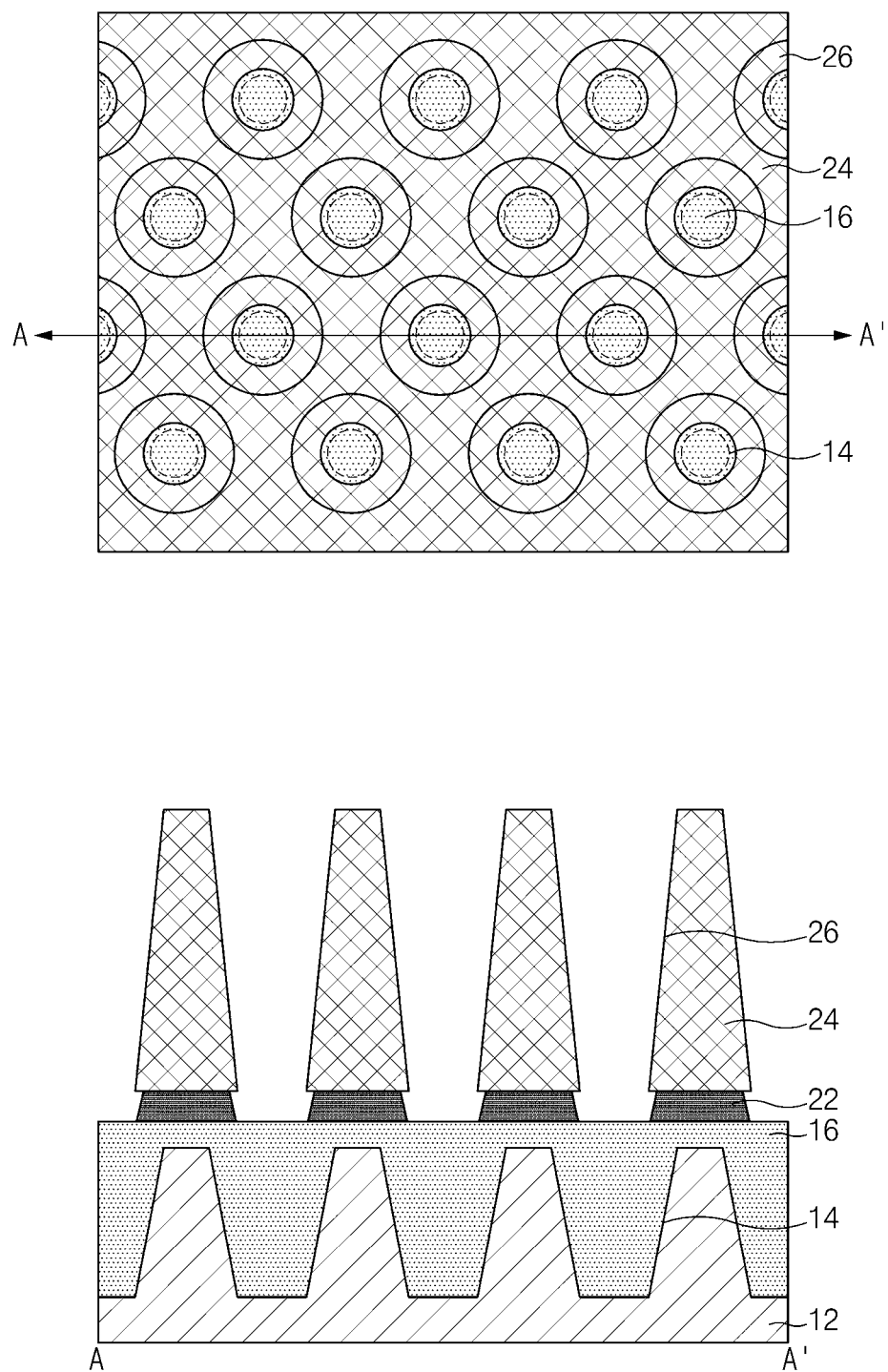
FIG. 9 illustrates an example of a light absorption structure based on another embodiment of the disclosed technology.

FIG. 9 illustrates an example of a light absorption structure based on another embodiment of the disclosed technology.

In the above-mentioned embodiment, the grooves 14 are not formed under the through-holes 26 that are partially formed as illustrated at the right-hand side and the left-hand side of the vertical cross-sectional view of FIG. 8.

In contrast, as shown in FIG. 9, grooves 14 may be formed in a manner that the reflection prevention layer 16 having a large thickness can also be formed under such partially formed through-holes. In other words, the grooves 14 of the light absorption structure may be formed under all the through-holes 26 on a one to one basis.

In some embodiments of the disclosed technology, a method of forming an image sensing device including a pad region in which pads are formed to electrically couple logic circuits of the image sensing device to an external circuit outside the image sensing device, includes providing a substrate, forming a plurality of grooves in the pad region on the substrate, forming a reflection prevention layer over the plurality of grooves including inside the plurality of grooves, forming a conductive layer over the reflection prevention layer, coating a photoresist on the conductive layer, patterning the photoresist to define a region in which one or more through-holes are to be formed, such that the one or more through-holes are aligned with one or more of the plurality of grooves, etching the conductive layer using the patterned photoresist covering the conductive layer, thereby exposing the reflection prevention layer through the one or more through-holes, and stripping the photoresist.

Here, forming the plurality of grooves in the pad region includes coating a photoresist on the substrate, patterning the photoresist to define a region in which the plurality of grooves is to be formed, and etching the substrate using the patterned photoresist covering the substrate. The conductive layer includes aluminum (Al) or tungsten (W) or a combination of aluminum (Al) and tungsten (W) with or without others. The reflection prevention layer includes silicon nitride (SiNx), silicon oxide (SiOx), or silicon oxynitride (SiOxNy), or any two or more of silicon nitride (SiNx), silicon oxide (SiOx), or silicon oxynitride (SiOxNy) with or without others. Each through-hole is formed to taper towards the exposed reflection prevention layer to provide a light reflection path to direct light to the reflection prevention layer.

As is apparent from the above description, the image sensing device implemented based on various embodiments of the disclosed technology may allow most of light incident upon the metal film to be absorbed by a reflection prevention layer without being reflected from the metal film to outside the pads, thereby reducing/minimizing flare effects that can be caused by light reflected from the metal film.

Only a few implementations and examples are described for the disclosed technology. Other implementations, enhancements and variations can be made based on what is described and illustrated in this patent document.

What is claimed is:

1. An image sensing device comprising:
    a semiconductor substrate;
    a pixel region formed at the semiconductor substrate to include photosensing pixels that convert light into pixel signals;
    an adjacent region formed at the semiconductor substrate adjacent to the pixel region and structured to include one or more grooves;
    a reflection prevention layer formed in the adjacent region over the semiconductor substrate to fill in the one or more grooves, the reflection prevention layer configured to absorb light incident thereon to reduce light from the adjacent region to the pixel region; and
    a pad formed in the adjacent region over the reflection prevention layer to be electrically coupled to an external circuit, and structured to include one or more through-holes spatially corresponding to the one or more grooves, respectively.

2. The image sensing device according to claim 1, wherein the one or more through-holes are arranged to vertically overlap the one or more grooves.

3. The image sensing device according to claim 2, wherein a center point of each of the one or more through-holes is located at the same vertical line as a center point of a corresponding groove of the one or more grooves.

4. The image sensing device according to claim 1, wherein the pad includes a stacked structure of a tungsten layer and an aluminum layer.

5. The image sensing device according to claim 1, wherein a horizontal cross-sectional area of each of the one or more through-holes is identical in shape to a horizontal cross-sectional area of each of the one or more grooves.

6. The image sensing device according to claim 5, wherein each of the horizontal cross-sectional areas of the one or more through-holes and the one or more grooves is in a circular shape.

7. An image sensing device comprising:
    a semiconductor substrate;
    a pixel region formed at the semiconductor substrate to include photosensing pixels that convert light into pixel signals;
    an adjacent region formed at the semiconductor substrate adjacent to the pixel region and structured to include one or more grooves;
    a reflection prevention layer formed in the adjacent region over the semiconductor substrate to fill in the one or more grooves, the reflection prevention layer configured to reduce reflection of light incident thereon to reduce light from the adjacent region to the pixel region; and a metal layer formed in the adjacent region over the reflection prevention layer, and structured to include one or more through-holes spatially corresponding to the one or more grooves, respectively, wherein a horizontal cross-sectional area of each of the one or more through-holes is identical in shape to a horizontal cross-sectional area of each of the one or more grooves, and wherein the horizontal cross-sectional area of each of the one or more through-holes and the one or more grooves gradually decreases in size in a downward direction towards the semiconductor substrate.

8. An image sensing device comprising:

a pixel region including a plurality of unit pixels structured to convert light into an electrical signal;

a logic region including a plurality of logic circuits, each of the logic circuits is in communication with one or more of the unit pixels to receive the electrical signal from the pixel region and perform signal processing of the received electrical signal; and a pad region including a pad configured to electrically couple the logic circuits to an external circuit, wherein the pad includes at least one through-hole and the pad region includes a light absorption structure, and wherein the at least one through-hole is structured to provide a light reflection path to direct light to the light absorption structure, and the light absorption structure is formed to absorb the light received through the at least one through-hole.

9. The image sensing device according to claim 8, wherein the light absorption structure includes:

a semiconductor substrate including at least one groove formed to be aligned with the at least one through-hole and to have a predetermined depth; and a reflection prevention layer formed between the semiconductor substrate and the pad in a manner that the at least one groove is filled with the reflection prevention layer.

10. The image sensing device according to claim 9, wherein the at least one through-hole is formed at a specific position where the at least one through-hole is formed to vertically overlap the at least one groove.

11. The image sensing device according to claim 10, wherein a center point of the at least one through-hole is aligned with a center point of the at least one groove.

12. The image sensing device according to claim 9, wherein a horizontal cross-sectional area of each of the at least one through-hole and the at least one groove gradually decreases in size in a downward direction.

13. The image sensing device according to claim 8, wherein the pad includes a metal layer.

14. The image sensing device according to claim 13, wherein the metal layer includes a stacked structure of a tungsten layer and an aluminum layer.

15. The image sensing device according to claim 5, wherein the horizontal cross-sectional area of each of the one or more through-holes and the one or more grooves gradually decreases in size in a downward direction towards the semiconductor substrate.

16. The image sensing device according to claim 7, wherein the one or more through-holes are arranged to vertically overlap the one or more grooves.

17. The image sensing device according to claim 16, wherein a center point of each of the one or more through-holes is located at the same vertical line as a center point of a corresponding groove of the one or more grooves.

18. The image sensing device according to claim 7, wherein the metal layer includes a stacked structure of a tungsten layer and an aluminum layer.

19. The image sensing device according to claim 7, wherein each of the horizontal cross-sectional areas of the one or more through-holes and the one or more grooves is in a circular shape.

* * * * *